(12) United States Patent
Richards et al.

(10) Patent No.: US 10,409,080 B2
(45) Date of Patent: Sep. 10, 2019

(54) SPHERICAL DISPLAY USING FLEXIBLE SUBSTRATES

(71) Applicant: Facebook Technologies, LLC, Menlo Park, CA (US)

(72) Inventors: Evan M. Richards, Santa Clara, CA (US); Shizhe Shen, San Mateo, CA (US); Jianru Shi, Union City, CA (US); Yue Shi, Santa Clara, CA (US); Shie Ping Jeffrey Tseng, Los Altos, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 113 days.

(21) Appl. No.: 15/422,338

(22) Filed: Feb. 1, 2017

(65) Prior Publication Data
US 2018/0217393 A1 Aug. 2, 2018

(51) Int. Cl.
*G02B 27/22* (2018.01)
*G06F 3/01* (2006.01)
(Continued)

(52) U.S. Cl.
CPC ........ *G02B 27/2271* (2013.01); *G06F 1/163* (2013.01); *G06F 1/1652* (2013.01); *G06F 3/011* (2013.01); *G06F 3/012* (2013.01); *H01L 27/3293* (2013.01); *H01L 51/0097* (2013.01); *H01L 27/3244* (2013.01); *H01L 2251/5338* (2013.01)

(58) Field of Classification Search
CPC ............ G02B 27/2271; H01L 27/3262; H01L 51/009; G06F 1/1652
See application file for complete search history.

(56) References Cited

U.S. PATENT DOCUMENTS 4,794,024 A * 12/1988 Crowell .................... G09F 1/06
40/124.08
5,705,834 A * 1/1998 Egalon .................... H01L 33/20
257/79
(Continued)

FOREIGN PATENT DOCUMENTS

KR 20150012772 A * 2/2015
WO WO-2015077718 A1 * 5/2015 .......... H04M 13/383

*Primary Examiner* — Nitin Patel
*Assistant Examiner* — Robert M Stone
(74) *Attorney, Agent, or Firm* — Fenwick & West LLP (57) ABSTRACT

An organic light emitting diode (OLED) display including an OLED panel having a series of gore shaped panel portions that form a quasi-spherical display surface. Each gore shaped panel portion includes a middle portion, a first end portion, and a second end portion. The middle portions of adjacent gore shaped panel portions are separated by bend regions. The OLED panel is bent along the first bend regions and each gore shaped panel portion is bent, such as along second bend regions between the middle portion and end portions, to join adjacent first end portions and adjacent second end portions of the gore shaped panel portions. Two OLED displays may be mounted within a head-mounted display (HMD), each behind an optics block. The quasi-spherical display surface of each OLED display generates a substantially flat image for the user after light from the display surface passes through the optic block.

20 Claims, 11 Drawing Sheets

(51) Int. Cl.
  *H01L 27/32* (2006.01)
  *G06F 1/16* (2006.01)
  *H01L 51/00* (2006.01)

(56) References Cited

U.S. PATENT DOCUMENTS

| | | | | |
|---|---|---|---|---|
| 5,797,815 A * | 8/1998 | Goldman | ............... | A63H 33/18 446/46 |
| 6,221,457 B1 * | 4/2001 | Rasmussen | ............ | G09B 27/08 40/615 |
| 6,229,160 B1 * | 5/2001 | Krames | ................. | H01L 33/20 257/94 |
| 7,325,943 B2 * | 2/2008 | Benoit | ................ | H01L 51/5271 313/505 |
| 7,511,311 B2 * | 3/2009 | Kususe | .................. | H01L 24/06 257/94 |
| 7,546,702 B2 * | 6/2009 | Malkovas | ................ | G09F 1/08 40/124.08 |
| 7,598,149 B2 * | 10/2009 | Dawson | ................ | H01L 27/156 257/E21.377 |
| 7,789,531 B2 * | 9/2010 | Duong | ................... | H01L 33/20 362/257 |
| 8,430,530 B2 * | 4/2013 | Aurongzeb | ............ | F21V 14/02 362/249.04 |
| 8,582,209 B1 * | 11/2013 | Amirparviz | .......... | G02B 3/0056 359/630 |
| 9,261,262 B1 * | 2/2016 | Baloga | .................. | A47B 21/00 |
| 9,606,722 B2 * | 3/2017 | Yoo | ....................... | G06F 3/0488 |
| 9,759,420 B1 * | 9/2017 | Baloga | ................ | F21V 33/0012 |
| 2002/0075452 A1 * | 6/2002 | Kessler | ............... | G02B 27/225 353/7 |
| 2002/0196554 A1 * | 12/2002 | Cobb | ................ | G02B 27/0172 359/633 |
| 2004/0212882 A1 * | 10/2004 | Liang | ................ | G02B 27/2235 359/462 |
| 2004/0227703 A1 * | 11/2004 | Lamvik | .............. | G02B 27/0172 345/76 |
| 2004/0246250 A1 * | 12/2004 | Kaku | ..................... | G06T 15/04 345/419 |
| 2005/0088079 A1 * | 4/2005 | Daniels | .................... | B08B 1/04 313/504 |
| 2005/0110702 A1 * | 5/2005 | Aoki | ..................... | G06F 1/1601 345/30 |
| 2009/0255152 A1 * | 10/2009 | Tzuo | ........................ | G09F 1/06 40/1 |
| 2009/0275366 A1 * | 11/2009 | Schilling | ............... | G06F 1/1615 455/566 |
| 2010/0046210 A1 * | 2/2010 | Mathai | .................... | H01L 51/52 362/147 |
| 2012/0038570 A1 * | 2/2012 | Delaporte | ............. | G06F 1/1616 345/173 |
| 2012/0306910 A1 * | 12/2012 | Kim | ....................... | H04N 13/04 345/619 |
| 2013/0260362 A1 * | 10/2013 | Melashenko | .......... | G09B 19/00 434/430 |
| 2014/0056028 A1 * | 2/2014 | Nichol | ................. | G02B 6/0028 362/611 |
| 2014/0339527 A1 * | 11/2014 | Lee | ..................... | H01L 51/5256 257/40 |
| 2014/0340856 A1 * | 11/2014 | Yeo | ...................... | H05K 1/0281 361/749 |
| 2015/0084025 A1 * | 3/2015 | Horiguchi | .......... | H01L 51/5253 257/40 |
| 2015/0097756 A1 * | 4/2015 | Ziarati | ............... | G02B 27/0172 345/1.3 |
| 2015/0171374 A1 * | 6/2015 | Burrows | ................ | H01L 51/56 257/40 |
| 2015/0245488 A1 * | 8/2015 | Jang | ........................ | G06F 1/16 361/749 |
| 2016/0320559 A1 * | 11/2016 | Richards | ................ | G02B 6/06 |
| 2016/0341953 A1 * | 11/2016 | Tseng | ................ | G02B 27/0176 |
| 2017/0171533 A1 * | 6/2017 | Benitez | ................ | H04N 13/383 |
| 2017/0249874 A1 * | 8/2017 | Lopez Fernandez | ... | G09F 1/065 |
| 2018/0082632 A1 * | 3/2018 | Lee | ..................... | G09G 3/3225 |

* cited by examiner

```
┌─────────────────────────────────────────────┐
│ Fabricate an OLED panel having a series of  │
│ gore shaped panel portions between panel    │
│ bend regions, and gore bend regions on      │
│ the gore shaped panel portions              │
│                    710                      │
└─────────────────────────────────────────────┘
                     │
                     ▼
┌─────────────────────────────────────────────┐
│  Bend the OLED panel along the panel bend   │
│                   regions                   │
│                    720                      │
└─────────────────────────────────────────────┘
                     │
                     ▼
┌─────────────────────────────────────────────┐
│  Bend each gore shaped panel portion along  │
│  the gore bend regions to join end portions │
│      of adjacent gore shaped panel          │
│                  portions                   │
│                    730                      │
└─────────────────────────────────────────────┘
```

SPHERICAL DISPLAY USING FLEXIBLE SUBSTRATES

BACKGROUND

Head-mounted displays (HMDs) may include an optics block, including one or more optical elements, positioned between an electronic display and the user's eye. The optics block can provide for adjustable focal lengths between the user's eye and the electronic display. When a flat electronic display is used, the optics block can bend light outwards from a straight image plane of the electronic display. This can result in the distortion of images presented to the user, especially at the peripheral regions of the flat electronic display after light from the electronic display is passed through the optics block.

SUMMARY

An organic light emitting diode (OLED) display including an OLED panel having a series of gore shaped panel portions that form a quasi-spherical display surface. Each gore shaped panel portion includes a middle portion, a first end portion, and a second end portion. The middle portions of adjacent gore shaped panel portions are separated by bend regions. The OLED panel is bent along the bend regions and each gore shaped panel portion is bent, such as along second bend regions between the middle portion and end portions, to join adjacent first end portions and adjacent second end portions of the gore shaped panel portions. Two OLED displays may be mounted within a head-mounted display (HMD), each behind an optics block. The quasi-spherical display surface of each OLED display generates a substantially flat image for the user after light from the display surface passes through the optic block.

Some embodiments may include method of manufacturing an organic light emitting diode (OLED) display. The method may include: fabricating an OLED panel having a series of gore shaped panel portions, each gore shaped panel portion including a middle portion, a first end portion, and a second end portion, the middle portions of adjacent gore shaped panel portions separated by first bend regions; and forming a quasi-spherical display surface from the OLED panel by: bending the OLED panel along the first bend regions; and bending each gore shaped panel portion to join adjacent first end portions and adjacent second end portions of the gore shaped panel portions.

Some embodiments may include a head-mounted display (HMD) including a left quasi-spherical OLED display and a right quasi-spherical OLED display. A left optics block is positioned in front of the left quasi-spherical OLED display to direct light emitted from the left quasi-spherical OLED display, and a right optics block is positioned in front of the right quasi-spherical OLED display to direct light emitted from the right quasi-spherical OLED display. Because of the shape of each quasi-spherical OLED display, light emitted from quasi-spherical display surface produce a substantially flat image for the user after the light passes through the optics block.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Configuration Overview

OLED displays with flat display surfaces that are bent to approximate circular convex displays are discussed herein. The flat display surfaces collectively form a quasi-spherical display surface. An OLED panel has a series of gore shaped panel portions that are bent to approximate a circular convex shape. When the OLED display is mounted in a HMD with an optics block, the quasi-spherical display surface compensates for light distortion introduced by an optics block in the HMD to provide a substantially flat image to the user's eye.

System Overview

Figure 1:
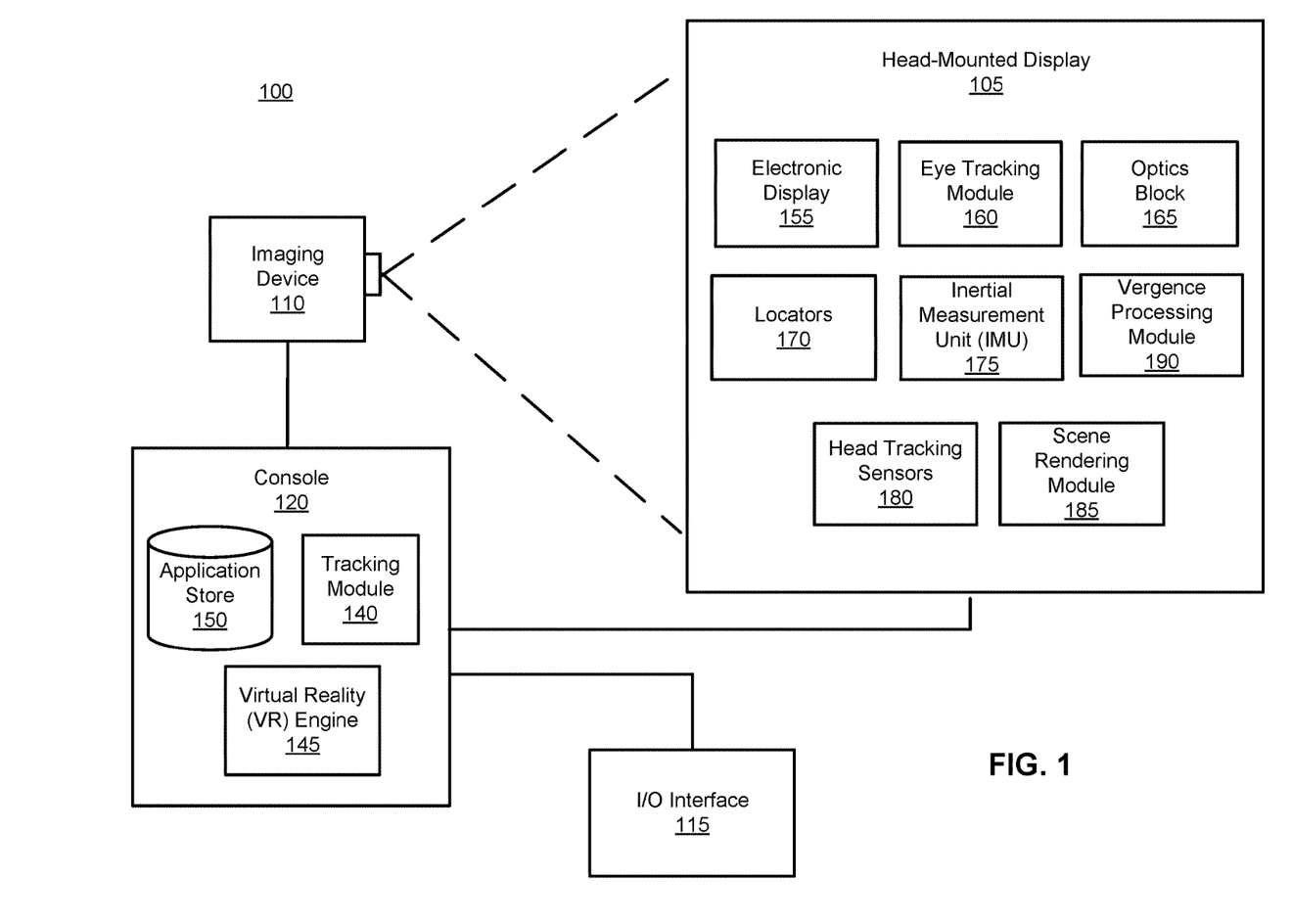
FIG. 1 shows a system, in accordance with some embodiments.

FIG. 1 shows a system 100 including a head-mounted display (HMD). The system 100 may be for use as a virtual reality (VR) system, an augmented reality (AR) system, a mixed reality (MR) system, or some combination thereof. In this example, the system 100 includes a HMD 105, an imaging device 110, and an input/output (I/O) interface 115, which are each coupled to a console 120. While FIG. 1 shows a single HMD 105, a single imaging device 110, and an I/O interface 115, in other embodiments, any number of these components may be included in the system. For example, there may be multiple HMDs 105 each having an associated input interface 115 and being monitored by one or more imaging devices 110, with each HMD 105, I/O interface 115, and imaging devices 110 communicating with the console 120. In alternative configurations, different and/or additional components may also be included in the system 100. The HMD 105 may act as a VR, AR, and/or a MR HMD. An MR and/or AR HMD augments views of a physical, real-world environment with computer-generated elements (e.g., images, video, sound, etc.).

The HMD 105 presents content to a user. Example content includes images, video, audio, or some combination thereof. Audio content may be presented via a separate device (e.g., speakers and/or headphones) external to the HMD 105 that receives audio information from the HMD 105, the console 120, or both. The HMD 105 includes an electronic display 155, an eye tracking module 160, an optics block 165, one or more locators 170, an internal measurement unit (IMU) 175, head tracking sensors 180, and a scene rendering module 185, and a vergence processing module 190.

The electronic display 155 includes an OLED display. As discussed in greater detail below, the OLED display may include quasi-spherical display surfaces formed from an OLED panel having a series of gore shaped panel portions. The OLED panel includes bend regions between the gore shaped panel portions, and the OLED panel is bent along the bend regions such that the gore shaped panel portions form the quasi-spherical display surface.

The optics block 165 adjusts its focal length responsive to instructions from the console 120. In some embodiments, the optics block 165 includes a multi multifocal block to adjust a focal length (adjusts optical power) of the optics block 165.

The eye tracking module 160 tracks an eye position and eye movement of a user of the HMD 105. A camera or other optical sensor inside the HMD 105 captures image information of a user's eyes, and the eye tracking module 160 uses the captured information to determine interpupillary distance, interocular distance, a three-dimensional (3D) position of each eye relative to the HMD 105 (e.g., for distortion adjustment purposes), including a magnitude of torsion and rotation (i.e., roll, pitch, and yaw) and gaze directions for each eye. The information for the position and orientation of the user's eyes is used to determine the gaze point in a virtual scene presented by the HMD 105 where the user is looking.

The vergence processing module 190 determines a vergence depth of a user's gaze based on the gaze point or an estimated intersection of the gaze lines determined by the eye tracking module 160. Vergence is the simultaneous movement or rotation of both eyes in opposite directions to maintain single binocular vision, which is naturally and automatically performed by the human eye. Thus, a location where a user's eyes are verged is where the user is looking and is also typically the location where the user's eyes are focused. For example, the vergence processing module 190 triangulates the gaze lines to estimate a distance or depth from the user associated with intersection of the gaze lines. The depth associated with intersection of the gaze lines can then be used as an approximation for the accommodation distance, which identifies a distance from the user where the user's eyes are directed. Thus, the vergence distance allows determination of a location where the user's eyes should be focused.

The locators 170 are objects located in specific positions on the HMD 105 relative to one another and relative to a specific reference point on the HMD 105. A locator 170 may be a light emitting diode (LED), a corner cube reflector, a reflective marker, a type of light source that contrasts with an environment in which the HMD 805 operates, or some combination thereof. Active locators 170 (i.e., an LED or other type of light emitting device) may emit light in the visible band (~380 nm to 850 nm), in the infrared (IR) band (~850 nm to 1 mm), in the ultraviolet band (10 nm to 380 nm), some other portion of the electromagnetic spectrum, or some combination thereof.

The locators 170 can be located beneath an outer surface of the HMD 105, which is transparent to the wavelengths of light emitted or reflected by the locators 170 or is thin enough not to substantially attenuate the wavelengths of light emitted or reflected by the locators 170. Further, the outer surface or other portions of the HMD 105 can be opaque in the visible band of wavelengths of light. Thus, the locators 170 may emit light in the IR band while under an outer surface of the HMD 105 that is transparent in the IR band but opaque in the visible band.

The IMU 175 is an electronic device that generates fast calibration data based on measurement signals received from one or more of the head tracking sensors 180, which generate one or more measurement signals in response to motion of HMD 105. Examples of the head tracking sensors 180 include accelerometers, gyroscopes, magnetometers, other sensors suitable for detecting motion, correcting error associated with the IMU 175, or some combination thereof. The head tracking sensors 180 may be located external to the IMU 175, internal to the IMU 175, or some combination thereof.

Based on the measurement signals from the head tracking sensors 180, the IMU 175 generates fast calibration data indicating an estimated position of the HMD 105 relative to an initial position of the HMD 105. For example, the head tracking sensors 180 include multiple accelerometers to measure translational motion (forward/back, up/down, left/right) and multiple gyroscopes to measure rotational motion (e.g., pitch, yaw, and roll). The IMU 175 can, for example, rapidly sample the measurement signals and calculate the estimated position of the HMD 105 from the sampled data. For example, the IMU 175 integrates measurement signals received from the accelerometers over time to estimate a velocity vector and integrates the velocity vector over time to determine an estimated position of a reference point on the HMD 105. The reference point is a point that may be used to describe the position of the HMD 105. While the reference point may generally be defined as a point in space, in various embodiments, a reference point is defined as a point within the HMD 105 (e.g., a center of the IMU 175). Alternatively, the IMU 175 provides the sampled measurement signals to the console 120, which determines the fast calibration data.

The IMU 175 can additionally receive one or more calibration parameters from the console 120. As further discussed below, the one or more calibration parameters are used to maintain tracking of the HMD 105. Based on a received calibration parameter, the IMU 175 may adjust one or more of the IMU parameters (e.g., sample rate). In some embodiments, certain calibration parameters cause the IMU 175 to update an initial position of the reference point to correspond to a next calibrated position of the reference point. Updating the initial position of the reference point as the next calibrated position of the reference point helps reduce accumulated error associated with determining the estimated position. The accumulated error, also referred to as drift error, causes the estimated position of the reference point to "drift" away from the actual position of the reference point over time.

The scene rendering module 185 receives content for the virtual scene from a VR engine 145 and provides the content for display on the electronic display 155. Additionally, the scene rendering module 185 can adjust the content based on information from the IMU 175, the vergence processing module 830, and the head tracking sensors 180. The scene rendering module 185 determines a portion of the content to be displayed on the electronic display 155 based on one or more of the tracking module 140, the head tracking sensors 180, or the IMU 175.

The imaging device 110 generates slow calibration data in accordance with calibration parameters received from the console 120. Slow calibration data includes one or more images showing observed positions of the locators 125 that are detectable by imaging device 110. The imaging device 110 may include one or more cameras, one or more video cameras, other devices capable of capturing images including one or more locators 170, or some combination thereof. Additionally, the imaging device 110 may include one or more filters (e.g., for increasing signal to noise ratio). The imaging device 110 is configured to detect light emitted or reflected from the locators 170 in a field of view of the imaging device 110. In embodiments where the locators 170 include passive elements (e.g., a retroreflector), the imaging device 110 may include a light source that illuminates some or all of the locators 170, which retro-reflect the light towards the light source in the imaging device 110. Slow calibration data is communicated from the imaging device 110 to the console 120, and the imaging device 110 receives one or more calibration parameters from the console 120 to adjust one or more imaging parameters (e.g., focal length, focus, frame rate, ISO, sensor temperature, shutter speed, aperture, etc.).

The I/O interface 115 is a device that allows a user to send action requests to the console 120. An action request is a request to perform a particular action. For example, an action request may be to start or end an application or to perform a particular action within the application. The I/O interface 115 may include one or more input devices. Example input devices include a keyboard, a mouse, a hand-held controller, a glove controller, or any other suitable device for receiving action requests and communicating the received action requests to the console 120. An action request received by the I/O interface 115 is communicated to the console 120, which performs an action corresponding to the action request. In some embodiments, the I/O interface 115 may provide haptic feedback to the user in accordance with instructions received from the console 120. For example, haptic feedback is provided by the I/O interface 115 when an action request is received, or the console 120 communicates instructions to the I/O interface 115 causing the I/O interface 115 to generate haptic feedback when the console 120 performs an action.

The console 120 provides content to the HMD 105 for presentation to the user in accordance with information received from the imaging device 110, the HMD 105, or the I/O interface 115. The console 120 includes an application store 150, a tracking module 140, and the VR engine 145. Some embodiments of the console 120 have different or additional modules than those described in conjunction with FIG. 1. Similarly, the functions further described below may be distributed among components of the console 120 in a different manner than is described here.

The application store 150 stores one or more applications for execution by the console 120. An application is a group of instructions, that when executed by a processor, generates content for presentation to the user. Content generated by an application may be in response to inputs received from the user via movement of the HMD 105 or the I/O interface 115. Examples of applications include gaming applications, conferencing applications, video playback application, or other suitable applications.

The tracking module 140 calibrates the system 100 using one or more calibration parameters and may adjust one or more calibration parameters to reduce error in determining position of the HMD 105. For example, the tracking module 140 adjusts the focus of the imaging device 110 to obtain a more accurate position for observed locators 170 on the HMD 105. Moreover, calibration performed by the tracking module 140 also accounts for information received from the IMU 175. Additionally, if tracking of the HMD 105 is lost (e.g., imaging device 110 loses line of sight of at least a threshold number of locators 170), the tracking module 140 re-calibrates some or all of the system 100 components.

Additionally, the tracking module 140 tracks the movement of the HMD 105 using slow calibration information from the imaging device 110 and determines positions of a reference point on the HMD 105 using observed locators from the slow calibration information and a model of the HMD 105. The tracking module 140 also determines positions of the reference point on the HMD 105 using position information from the fast calibration information from the IMU 175 on the HMD 105. Additionally, the tracking module 160 may use portions of the fast calibration information, the slow calibration information, or some combination thereof, to predict a future location of the HMD 105, which is provided to the VR engine 145.

The VR engine 145 executes applications within the system 100 and receives position information, acceleration information, velocity information, predicted future positions, or some combination thereof for the HMD 105 from the tracking module 140. Based on the received information, the VR engine 145 determines content to provide to the HMD 105 for presentation to the user, such as a virtual scene, one or more virtual objects to overlay onto a real world scene, etc.

In some embodiments, the VR engine 145 maintains focal capability information of the optics block 165. Focal capability information is information that describes what focal distances are available to the optics block 165. Focal capability information may include, e.g., a range of focus the optics block 165 is able to accommodate (e.g., 0 to 4 diopters), a resolution of focus (e.g., 0.25 diopters), a number of focal planes, combinations of settings for switchable half wave plates (SHWPs) (e.g., active or non-active) that map to particular focal planes, combinations of settings for SHWPS and active liquid crystal lenses that map to particular focal planes, or some combination thereof.

The VR engine 145 generates instructions for the optics block 165, the instructions causing the optics block 165 to adjust its focal distance to a particular location. The VR engine 145 generates the instructions based on focal capability information and, e.g., information from the vergence processing module 190, the IMU 175, and the head tracking sensors 180. The VR engine 145 uses the information from the vergence processing module 190, the IMU 175, and the head tracking sensors 180, or some combination thereof, to select an ideal focal plane to present content to the user. The VR engine 145 then uses the focal capability information to select a focal plane that is closest to the ideal focal plane. The VR engine 145 uses the focal information to determine settings for one or more SHWPs, one or more active liquid crystal lenses, or some combination thereof, within the optics block 176 that are associated with the selected focal plane. The VR engine 145 generates instructions based on the determined settings, and provides the instructions to the optics block 165.

The VR engine 145 performs an action within an application executing on the console 120 in response to an action request received from the I/O interface 115 and provides feedback to the user that the action was performed. The provided feedback may be visual or audible feedback via the HMD 105 or haptic feedback via the I/O interface 115.

Figure 2:
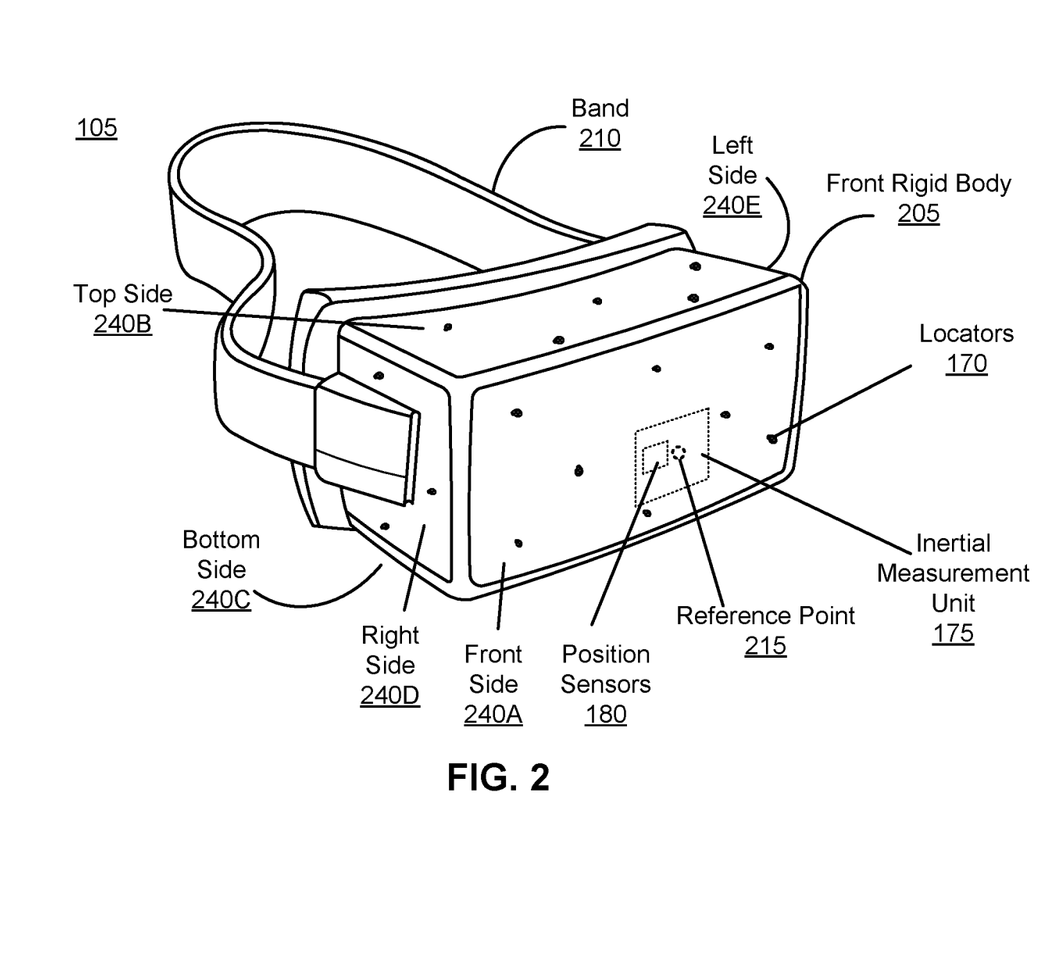
FIG. 2 shows a head-mounted display (HMD), in accordance with some embodiments.

FIG. 2 shows a head-mounted display (HMD) 105, in accordance with some embodiments. The HMD 105 includes a front rigid body 205 and a band 210. The front rigid body 205 includes an electronic display (not shown), an inertial measurement unit (IMU) 175, one or more position sensors 180, and locators 170. In some embodiments, a user movement is detected by use of the inertial measurement unit 175, position sensors 180, and/or the locators 170, and an image is presented to a user through the electronic display according to the user movement detected. In some embodiments, the HMD 105 can be used for presenting a virtual reality, an augmented reality, or a mixed reality to a user.

A position sensor 180 generates one or more measurement signals in response to motion of the HMD 105. Examples of position sensors 180 include: one or more accelerometers, one or more gyroscopes, one or more magnetometers, another suitable type of sensor that detects motion, a type of sensor used for error correction of the IMU 175, or some combination thereof. The position sensors 180 may be located external to the IMU 175, internal to the IMU 175, or some combination thereof. In FIG. 2, the position sensors 180 are located within the IMU 175, and neither the IMU 175 nor the position sensors 180 are visible to the user.

Based on the one or more measurement signals from one or more position sensors 180, the IMU 175 generates calibration data indicating an estimated position of the HMD 105 relative to an initial position of the HMD 105. In some embodiments, the IMU 175 rapidly samples the measurement signals and calculates the estimated position of the HMD 100 from the sampled data. For example, the IMU 175 integrates the measurement signals received from the accelerometers over time to estimate a velocity vector and integrates the velocity vector over time to determine an estimated position of a reference point on the HMD 105. Alternatively, the IMU 17 provides the sampled measurement signals to a console (e.g., a computer), which determines the calibration data. The reference point is a point that may be used to describe the position of the HMD 105. While the reference point may generally be defined as a point in space; however, in practice the reference point is defined as a point within the HMD 105 (e.g., a center of the IMU 175).

The locators 180 are located in fixed positions on the front rigid body 205 relative to one another and relative to a reference point 215. In FIG. 2, the reference point 215 is located at the center of the IMU 175. Each of the locators 170 emits light that is detectable by an imaging device (e.g., camera or an image sensor). Locators 170, or portions of locators 170, are located on a front side 240A, a top side 240B, a bottom side 240C, a right side 240D, and a left side 240E of the front rigid body 205 in the example of FIG. 2.

Figure 3:
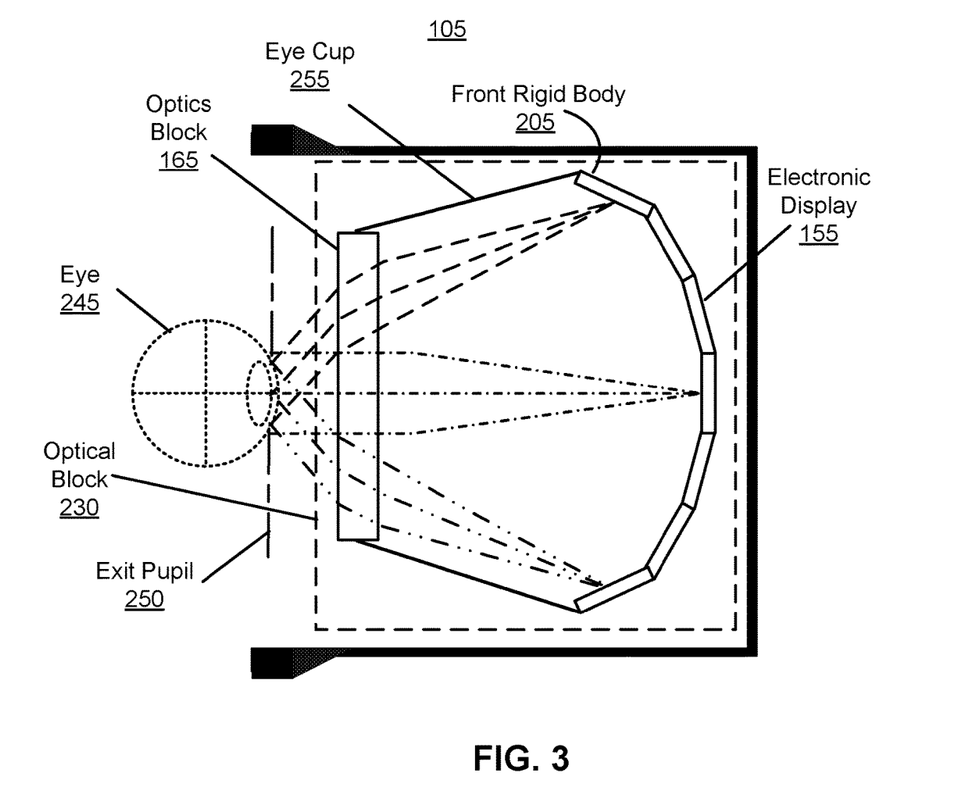
FIG. 3 shows a cross section of a front rigid body of the HMD in FIG. 2, in accordance with some embodiments.

FIG. 3 shows a cross section of the front rigid body 205 of the HMD 105 shown in FIG. 2. The front rigid body 205 includes an optical block 230 that provides altered image light to an exit pupil 250. The exit pupil 250 is the location in the front rigid body 205 where a user's eye 245 is positioned.

The optical block 230 includes the electronic display 155, the optics block 165, and an eye cup 255. The eye cup 255 is mechanically secured with the front rigid body 205, and holds the optics block 165. The electronic display 155 emits image light toward the optics block 165. The optics block 165 magnifies the image light, and in some embodiments, also corrects for one or more additional optical errors (e.g., distortion, astigmatism, etc.). The optics block 165 directs the image light to the exit pupil 250 for presentation to the user. In some embodiments, the optics block 165 and the eye cone 255 may be omitted from the optical block 230.

For purposes of illustration, FIG. 3 shows a cross section associated with a single eye 245, but the HMD 105 may include another optical block that provides altered image light to another eye of the user. The two optical blocks are arranged adjacently with each other in the front rigid body 205, with a first optical block dedicated to the left eye and a second optical block is dedicated to the right eye.

Figure 4:
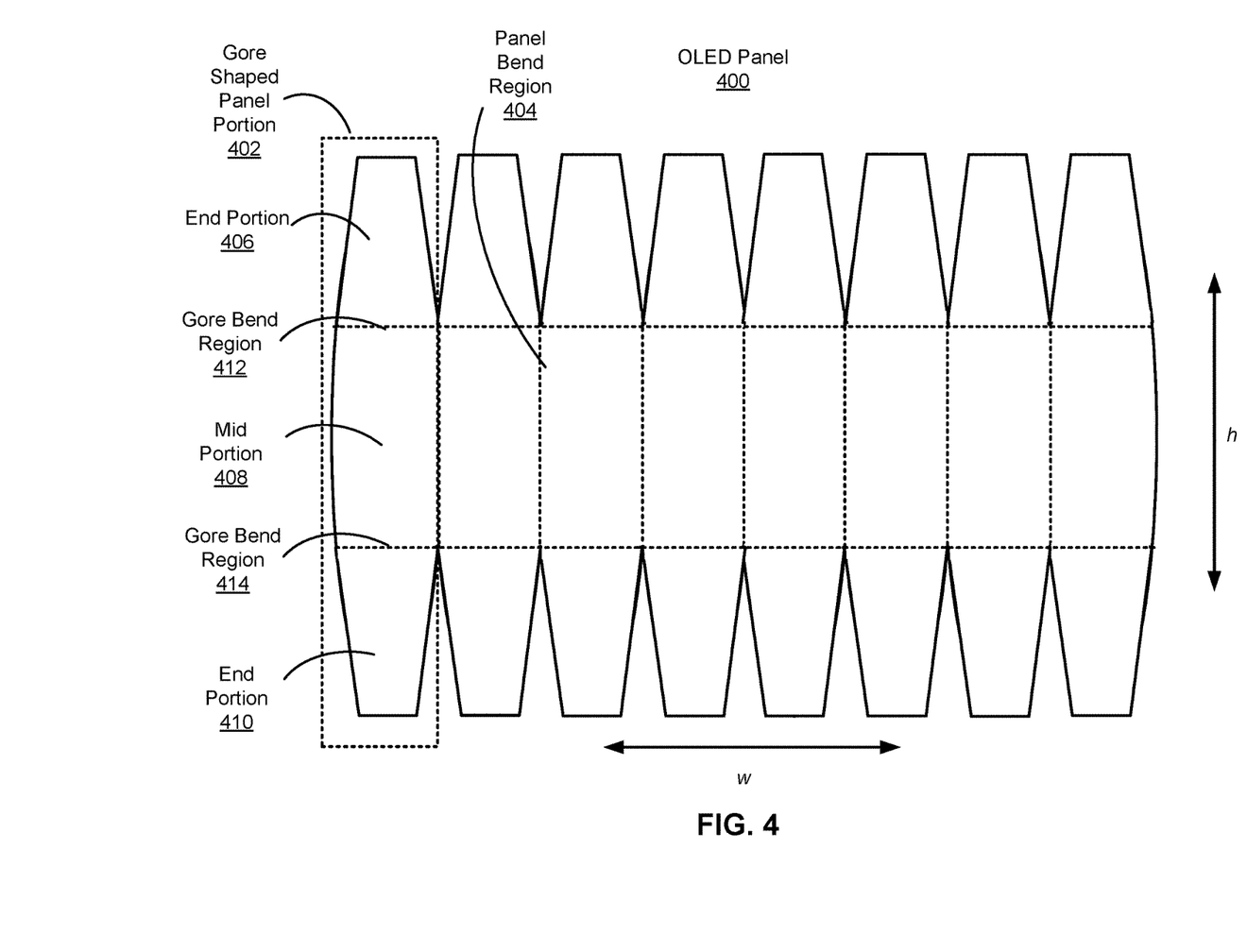
FIG. 4 shows an OLED panel, in accordance with some embodiments.
Figure 5A:
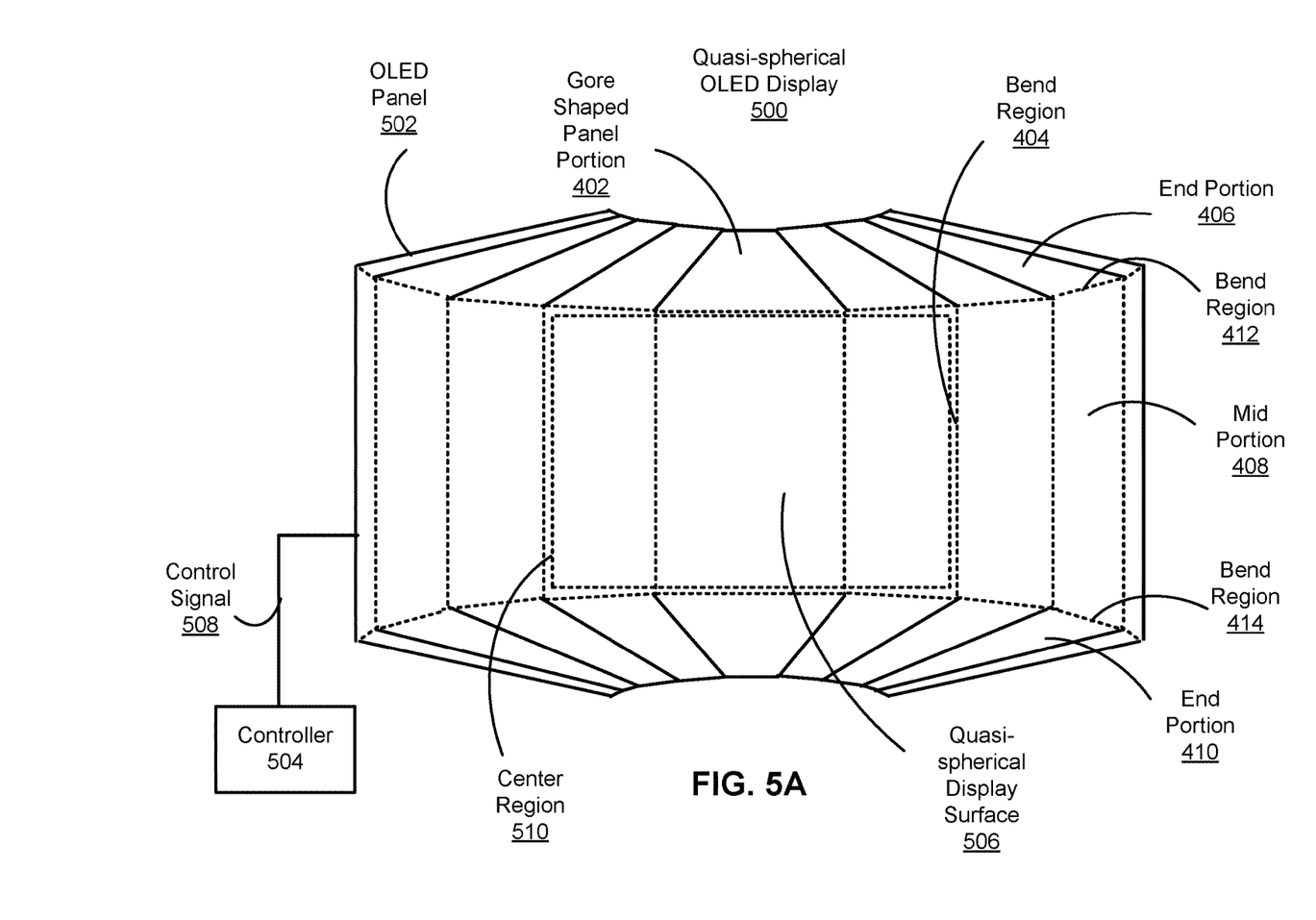
FIGS. 5A and 5B show front and side views, respectively, of a quasi-spherical OLED display, in accordance with some embodiments.
Figure 5B:
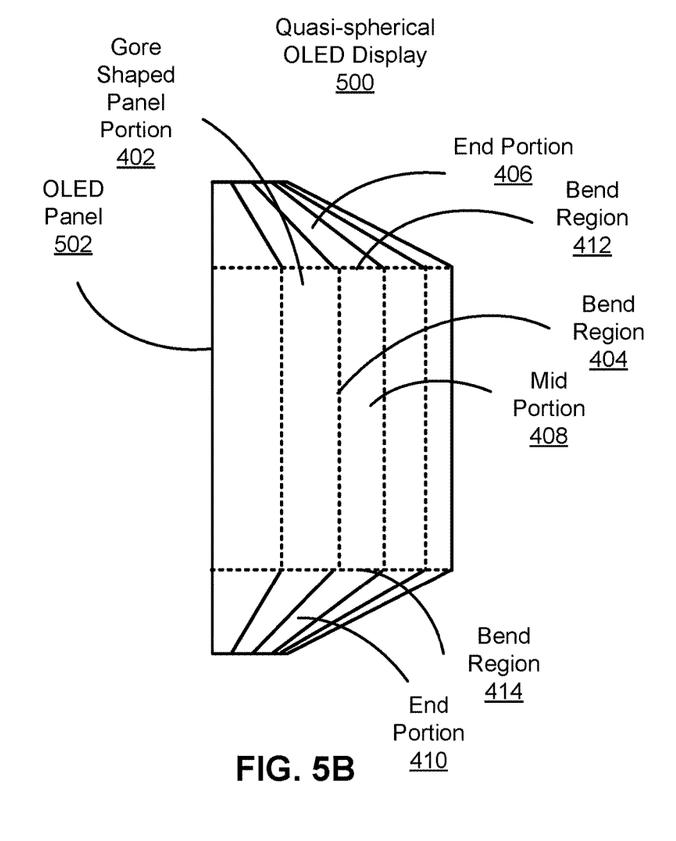

FIG. 4 shows an OLED panel 400, in accordance with some embodiments. The OLED panel 400 is a flat panel that can be formed into a quasi-spherical OLED display as shown in FIGS. 5A and 5B. The OLED panel 400 includes a series of gore shaped panel portions 402 separated by panel bend regions 404.

Figure 10:
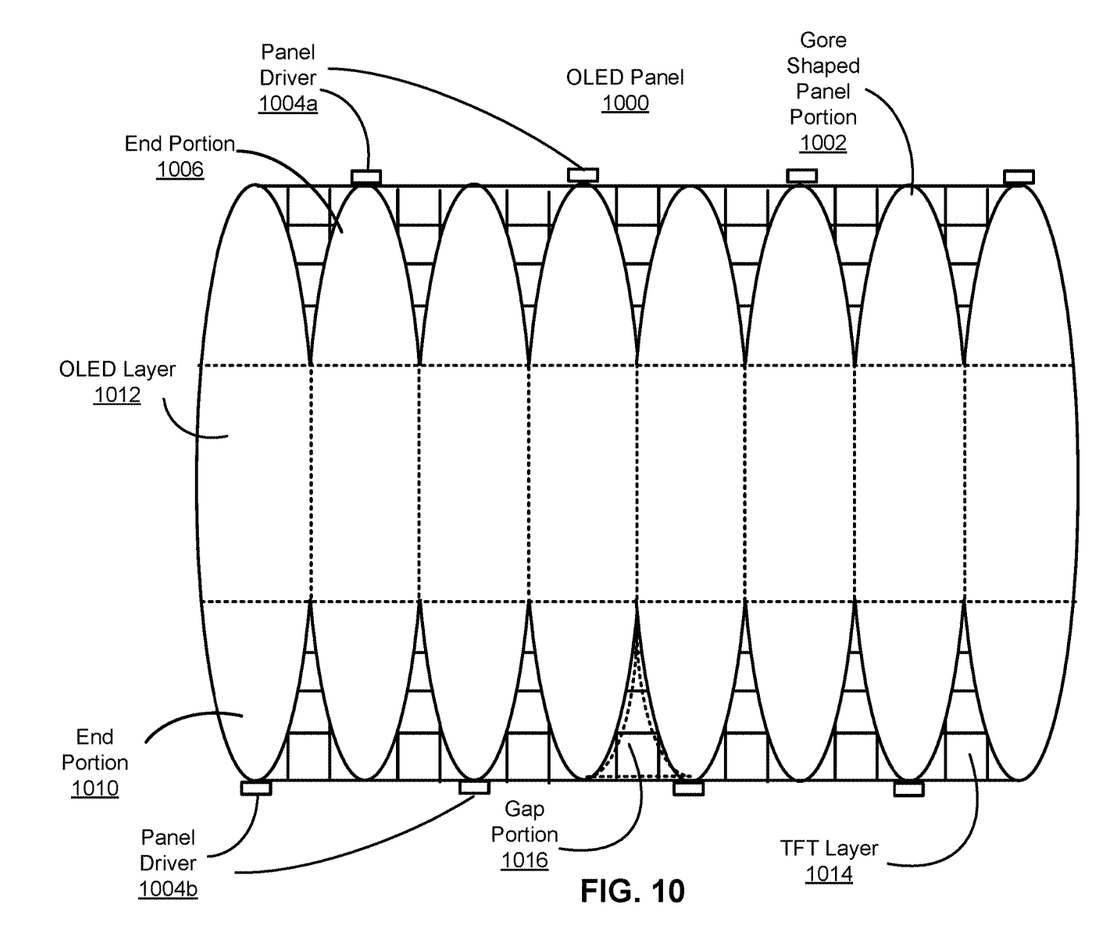
FIG. 10 shows an OLED panel including gap portions on between adjacent end portions of adjacent gore shaped panel portions, in accordance with some embodiments.

Each gore shaped panel portion 402 may include an end portion 406, a mid portion 408, and another end portion 410. The end portion 406 and mid portion 408 are separated by a bend region 412, and the mid portion 408 and the end portion 410 are separated by another bend region 414. The mid portions 408 may be rectangular shaped portions, and the end portions 406, 410 may be fin shaped or half oval shaped (e.g., as shown in FIG. 10) portions. The panel bend regions 404 may be defined between adjacent mid portions 408 of adjacent gore shaped panel portions 402.

The panel bend regions 404 are defined between the gore shaped panel portions 402 along a first axis, such as the vertical axis h. The gore bend regions 412 and 414 are on the gore shaped panel portions 402. The gore bend regions 412/414 are defined along a second axis, such as the horizontal axis w. In some embodiments, the first axis and second axis may be tangential to each other. The bend regions 404 and 412/414 are located at different locations of the OLED panel 400. The panel bend regions 404 do not intersect with the gore bend regions 412/414 such that no location on the OLED panel 400 is bent along multiple axes.

The OLED panel portion 400 may be fabricated as a flat, rectangular panel with portions cut out from the rectangular panel to form the gore shaped panel portions 402. In another example, the OLED panel portion 400 may be fabricated with the gore shaped panel portions 402.

FIGS. 5A and 5B show front and side views, respectively, of a quasi-spherical OLED display 500 (or "OLED display 500"), in accordance with some embodiments. The OLED display 500 is an example of an electronic display 155 of the HMD 105 that approximates a circular convex display. As discussed above, the HMD 105 may include two optical blocks 230, one optical block 230 for each of the user's eyes. Each optical block 230 may include a quasi-spherical OLED display 500.

The OLED display 500 includes an OLED panel 502 and a controller 504. The OLED panel 502 has a quasi-spherical display surface 506 formed from the gore shaped panel portions 402 of the flat OLED panel 400. Each gore shaped panel portion 402 forms a sector of the quasi-spherical display surface 506. The OLED panel 502 is formed from the OLED panel 400 by bending the OLED panel 400 along the panel bend regions 404 between the gore shaped panel portions 402, bending each of the gore bend regions 412 and 414 to join end portions 406 of adjacent gore shaped panel portions 402, and bending end portions 410 of adjacent gore shaped panel portions 402.

The controller 504 provides a control signal 508 that drives the OLED panel 502 to provide video images on the quasi-spherical display surface 506. In some embodiments, the controller 504 is configured to drive a center region 510 of the quasi-spherical display surface 506 at a higher resolution than peripheral regions of the quasi-spherical display surface 506 outside of the center region 510. In some embodiments, the controller 504 drives pixels at a middle portion of a gore shaped panel portion at a higher pixel density than pixels at an end portion. In some embodiments, the gore shaped panel portions 402 (or portions thereof) at the center region 510 are fabricated with a higher pixel density gore shaped panel portions 402 than outside of the center region 510. In some embodiments, a first controller controls the OLED panel 502 for pixels at the center region 510, and a separate second controller controls the pixels of the OLED panel 502 outside of the center region 510.

Figure 6:
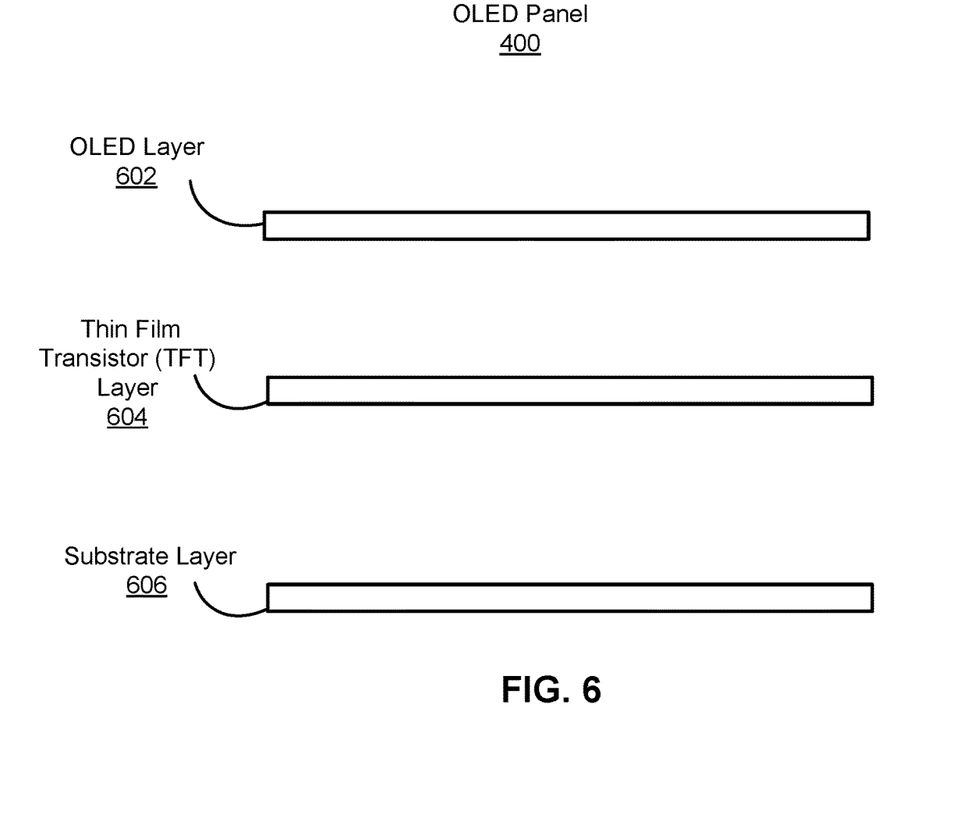
FIG. 6 shows a cross sectional side view of an OLED panel, in accordance with some embodiments.

FIG. 6 shows a cross sectional side view of the OLED panel 400, in accordance with some embodiments. The OLED panel 400 includes flexible layers that support bending. The OLED panel 400 includes an OLED layer 602, a thin film transistor (TFT) layer 604, and a substrate layer 606.

The substrate layer 606 is a flexible substrate to support the bending of the OLED panel 400. In some embodiments, the substrate layer 606 is a polyethylene terephthalate (PET) layer. The OLED layer 602 and the TFT layer 604 may be fabricated on the substrate layer 606. The OLED layer 602 includes anodes, an organic electroluminescent layer, and cathodes for a plurality of OLED pixels. The cathodes and anodes provide a current through the organic electroluminescent layer that causes light emission from the organic electroluminescent layer. The TFT layer 604 may be connected with the anodes to provide an active matrix of switching and driving transistors for controlling the current flowing to individual pixels.

The TFT layer 604 includes metal trace lines that form a matrix of source and drain electrodes of the TFT layer 604. In some embodiments, the TFT layer 604 has a reinforced structure at the bend regions 404, 412, and 414 of the OLED panel 400 to protect the OLED panel 400 from damage when bent along the bend regions 404, 412, and 414. For example, the metal trace lines that cross a bend region 404, 412, and 414 may include a winding pattern (e.g., rather than straight metal trace lines) to make the metal trace lines more resistant to bending along the bend regions 404, 412, and 414. Alternatively or additionally, the TFT layer 604 may include redundant metal trace lines at the bend regions 404, 412, and 414 to make the metal trace lines more resistant to bending at the bend regions 404, 412, and 414. In some embodiments, the TFT layer 604 is further reinforced at the bend regions 404, 412, and 414 by a passivation layer that protects the metal traces from moisture or air. In various embodiments, one or more layers of the OLED panel 400 may be reinforced at bending regions bend regions 404, 412, and 414, such as by incorporating flexible components, redundancy of components, protective materials, etc.

In some embodiments, the layers 602, 604, and 606 may have different size and shapes. For example, the OLED layer 602 may define the series of gore shaped panel portions, while the TFT layer 604 provides a rectangular matrix of metal trace lines for controlling the pixels of the OLED layer 602.

Figure 7:
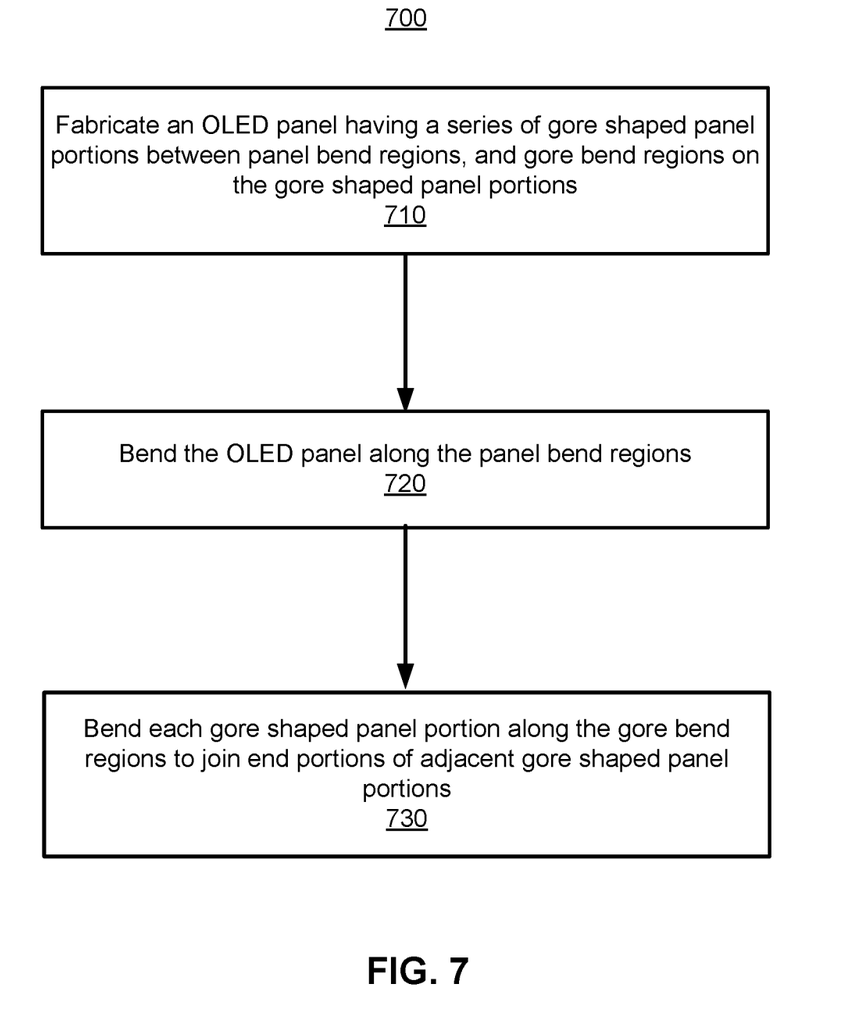
FIG. 7 shows a method of manufacturing a quasi-spherical OLED display, in accordance with some embodiments.

FIG. 7 shows a method 700 of manufacturing a quasi-spherical OLED display, in accordance with some embodiments. Method 700 includes fabricating 710 an OLED panel 400 having a series of gore shaped panel portions 402 between panel bend regions 404, and gore bend regions 412/414 on the gore shaped panel portions 402. As discussed in greater detail below, the OLED panel 400 is formed into the OLED panel 502 including quasi-spherical display surfaces subsequent to the fabrication. Fabricating the OLED panel 400 may include fabricating the OLED layer 602 and the TFT layer 604 on the flexible substrate layer 606. Fabricating the OLED panel 400 may further include fabricating the bend regions 404, 412, and 414, such as by incorporating a reinforced structure for the TFT layer 604 at the bend regions 404, 412, and 414 of the OLED panel 400.

The OLED panel 400 may be fabricated with the gore shaped portions 402 forming the desired final profile shape (e.g., such that the OLED panel 400 can be bent to form quasi-spherical panel 502). In some embodiments, the OLED panel 400 is fabricated as a flat, rectangular OLED panel before being bent along the bending regions. Portions may be removed from the rectangular OLED panel to form the gore shaped portions 402 and the desired profile shape.

In some embodiments, fabricating the OLED panel 400 includes fabricating one or more first panel drivers to control pixels at a first side of the OLED panel 500, and fabricating one or more second panel drivers to control pixels at a second side of the OLED panel 500. The one or more first panel drivers are positioned at a first side edge of the OLED panel 500. The one or more second panel drivers are positioned at a second side edge of the OLED panel opposite the first side edge.

The OLED panel 400 is bent 720 along the panel bend regions 404. Each panel bend region 404 defines a bending axis between adjacent gore shaped panel portions 402. Subsequent to bending along the panel bend regions 404, the gore shaped panel portions 402 form a quasi-curved display surface along the horizontal axis w.

Each gore shaped panel portion 402 is bent 730 along the gore bend regions 412 and 414 to join end portions of adjacent gore shaped panel portions 402. For example, the gore bend regions 412 of the gore shaped panel portions 402 may be bent to join the (e.g., top) end portions 406 of adjacent gore shaped panel portions 402. Similarly, the gore bend regions 414 of the gore shaped panel portions 402 may be bent to join the end portions 410 of adjacent gore shaped panel portions 402.

As such, the OLED panel 400 is bent along the panel bend regions 404 and the gore bend regions 412 and 414 to form the OLED panel 502 including the quasi-spherical display surface 506. The quasi-spherical display surface 506 includes flat display surfaces that collectively form a quasi-spherical shape.

In some embodiments, the OLED panel 502 is secured (e.g., via an adhesive material or mechanically) to a spherical holder to maintain the quasi-spherical shape. The holder may be a solid piece, made by injection molding. In some embodiments the holder may be a printed circuit board (PCB) backplane that connects panel drivers (e.g., as shown in FIG. 10) of the OLED panel 502 to the controller 504.

Figure 8:
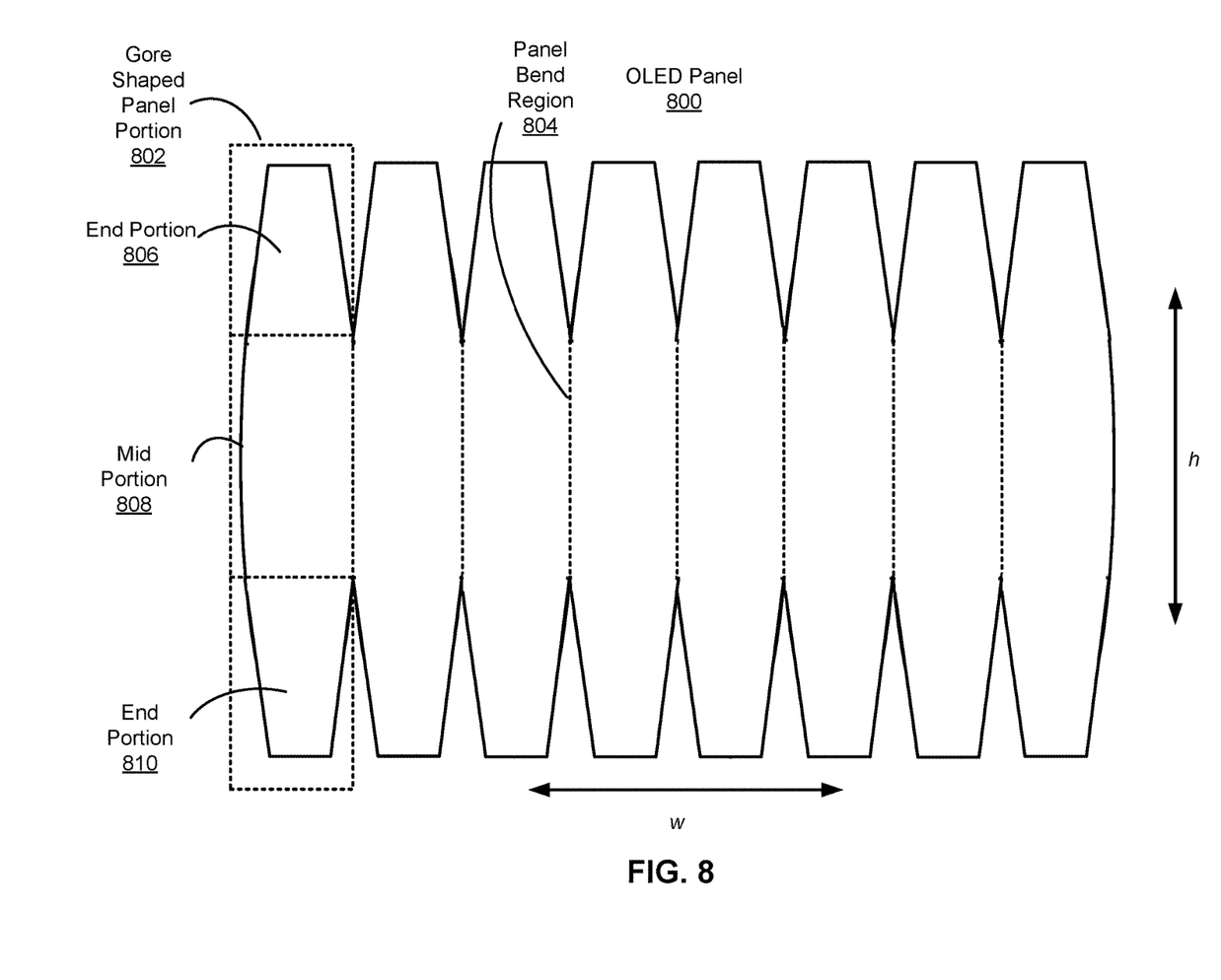
FIG. 8 shows an OLED panel including curved gore shaped panel portions, in accordance with some embodiments.
Figure 9:
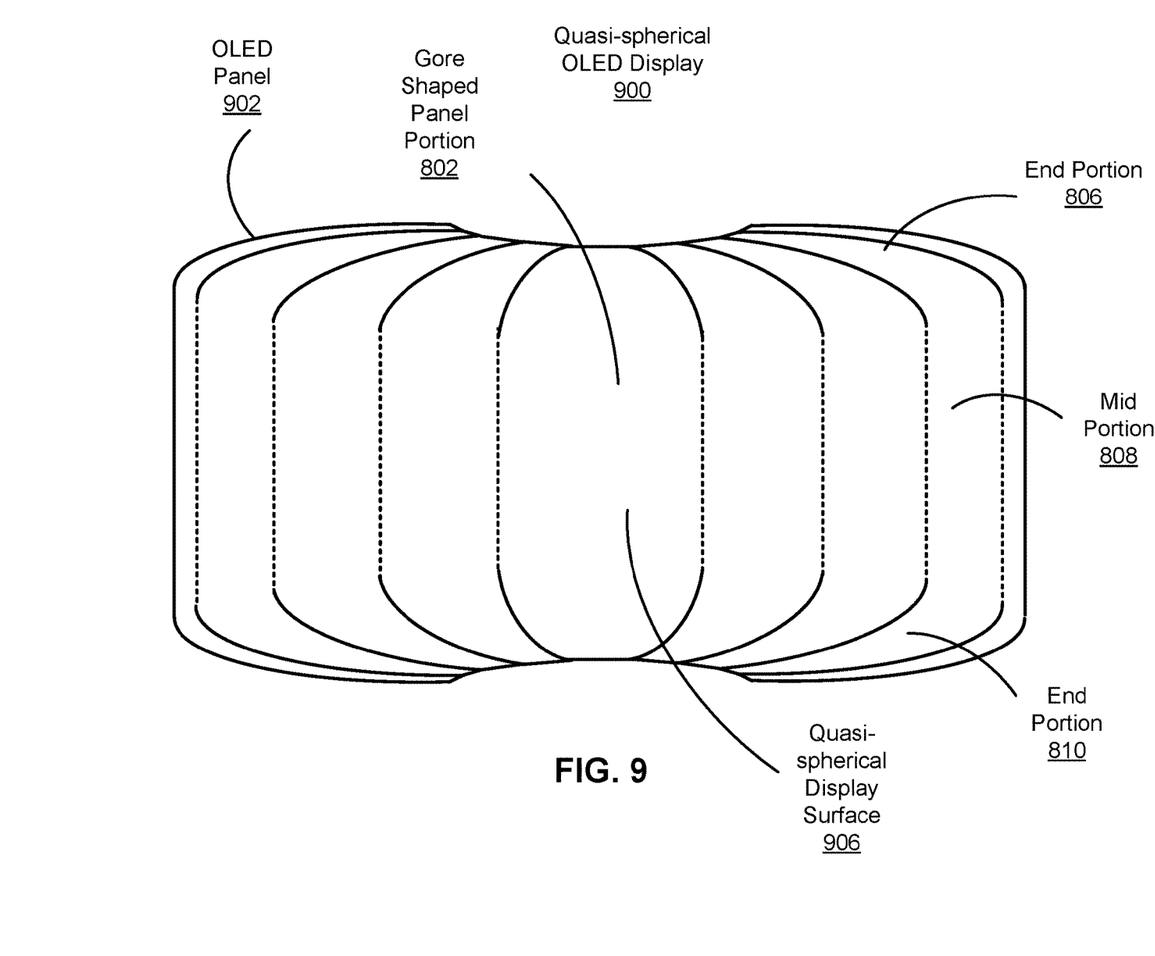
FIG. 9 shows a quasi-spherical OLED display including curved gore shaped panel portions, in accordance with some embodiments.

FIG. 8 shows an OLED panel 800 including curved gore shaped panel portions, in accordance with some embodiments. The OLED panel 800 is a flat panel that can be formed into a quasi-spherical OLED display having curved display surfaces as shown in FIG. 9. The OLED panel 800 includes a series of gore shaped panel portions 802 separated by panel bend regions 804. However, the OLED panel 800 does not include any gore bend regions on the gore shaped panel portions 802. Instead, each of the end portions 802 and 810 of each gore shaped panel portion 802 is curved to join adjacent gore shaped panel portions 802.

FIG. 9 shows a quasi-spherical OLED display 900 (or "OLED display 900") including curved gore shaped panel portions, in accordance with some embodiments. The OLED display 900 includes a quasi-spherical OLED panel 902 formed from the OLED panel 800, and is another example of an electronic display 155 of the HMD 105 that approximates a circular convex display. When the OLED panel 800 is bent along the panel bend regions 804, and the end portions 802 and 810 of each gore shaped panel portion 802 are curved, the OLED panel portion 800 forms the quasi-spherical display surface 906 with flat mid portions 808 and curved end portions 806 and 810.

FIG. 10 shows an OLED panel 1000 including gap portions on between adjacent end portions of adjacent gore shaped panel portions, in accordance with some embodiments. The OLED panel 1000 includes gore shaped panel portions 1002 defined by an OLED layer 1012, and an underlying TFT layer 1014 that provides a (e.g., rectangular) matrix of metal trace lines for controlling the pixels of the OLED layer 602. The OLED layer 1012 and TFT layer 1014 define gap portions 1016 of the TFT layer 1014 (and underlying substrate layer 606) between adjacent end portions 1006 (or adjacent end portions 1010) of adjacent gore shaped panel portions 1002. When the OLED panel 1000 is formed into the quasi-spherical display surface, adjacent end portions 1006 are joined, and adjacent end portions 1010 are joined as discussed above. The gap portions 1014 between adjacent end portions may be bent or folded behind the adjacent end portions when the adjacent end portions are joined.

In some embodiments, each gore shaped panel portion 1006 has one or more panel drivers 1004 to address each pixel of the gore shaped panel portion 1002. The one or more panel drivers 1004 of a gore shaped panel portion 1002 may be arranged at an end portion 1006 or end portion 1010 of the gore shaped panel portion 1002. Adjacent gore shaped panel portions 1002 include panel drivers on opposite end portions to form an alternating arrangement of panel drivers 1004a at (e.g., top) end portions 1006 and panel drivers 1004b at (e.g., bottom) end portions 1010. The panel drivers 1004a and 1004b may be integrated circuits connected with the controller 504 to receive the control signal 508. In some embodiments, the panel drivers may have a chip on flex (COF) configuration, and placed in a flat and rectangular region of the OLED panel 1000. For example, flexible printed circuits (FPC) could be placed anywhere along the non-emitting side of the OLED panel 1000.

In some embodiments, a bezel provides structural support for the OLED panel 1000. The bezel can be arranged along the peripheral display edge, or on portions of the OLED panel portion that are overlapped by other portions. Reinforcement of the OLED panel 1000 may be achieved by mating the formed display to a solid piece, such as one made by injection molding.

Additional Configuration Information

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method of manufacturing an organic light emitting diode (OLED) display, comprising:
    fabricating an OLED panel having a series of gore shaped panel portions, each gore shaped panel portion including a middle portion, a first end portion at a first side of the middle portion, and a second end portion at a second side of the middle portion opposite the first side, each gore shaped panel portion being tapered at the first and second end portions relative to the middle portion, the OLED panel including first bend regions between third sides of adjacent middle portions of the series of gore shaped panel portions; and
    forming a quasi-spherical display surface from the OLED panel by:
        bending the OLED panel along the first bend regions; and
        bending each gore shaped panel portion to join adjacent first end portions and adjacent second end portions of the gore shaped panel portions.

2. The method of claim 1, wherein:
    fabricating an OLED panel includes, for each gore shaped panel portion:
        fabricating a second bend region between the first end portion and middle portion; and
        fabricating a third bend region between the middle portion and the second end portion; and
    bending each gore shaped panel portion includes bending each of the gore shaped panel portions along the second bend region and the third bend region.

3. The method of claim 1, wherein bending each gore shaped panel portion includes curving the first end portion and the second end portion.

4. The method of claim 1, further including mounting the OLED panel to a spherical holder to maintain the quasi-spherical display surface.

5. The method of claim 1, wherein the OLED panel is flat prior to being bended to form the quasi-spherical display surface.

6. The method of claim 1, wherein fabricating the OLED panel includes:
    fabricating a thin film transistor (TFT) layer on a flexible substrate layer; and
    fabricating a OLED layer on the TFT layer.

7. The method of claim 6, wherein:
    the OLED layer defines the gore shaped panel portions;
    the TFT layer includes metal traces at gap portions of the TFT layer between the adjacent first end portions and adjacent second end portions of the gore shaped panel portions; and
    bending each gore shaped panel portion to join the adjacent first end portions and the adjacent second end portions of the gore shaped panel portions includes bending the gap portion behind the adjacent first end portions and adjacent second end portions of the OLED layer.

8. The method of claim 1, further including fabricating a panel driver at the first end portion or the second end portion of each gore shaped panel portion.

9. The method of claim 8, wherein adjacent gore shaped panel portions include panel drivers at opposite end portions.

10. The method of claim 1, further including a controller configured to drive pixels at a middle portion of a gore shaped panel portion at a higher resolution than pixels at a first end portion and a second end portion of the gore shaped panel portion.

11. An organic light emitting diode (OLED) display, comprising:
    an OLED panel having a series of gore shaped panel portions that form a quasi-spherical display surface, each gore shaped panel portion including a middle portion, a first end portion at a first side of the middle portion, and a second end portion at a second side of the middle portion opposite the first side, each gore shaped panel portion being tapered at the first and second end portions relative to the middle portion, the OLED panel including first bend regions between third sides of adjacent middle portions of the series of gore shaped panel portions, wherein the OLED panel is bent along the first bend regions and each gore shaped panel portion is bent to join adjacent first end portions and adjacent second end portions of the gore shaped panel portions.

12. The OLED display of claim 11, wherein:
each of the gore shaped panel portion includes a second bend region between the first end portion and middle portion, and a third bend region between the middle portion and the second end portion; and
the second and third bend regions of each gore shaped panel portion are bent to join the adjacent first end portions and the adjacent second end portions.

13. The OLED display of claim 11, wherein the first end portion and second end portion of each gore shaped panel portion are curved.

14. The OLED display of claim 11, further including a spherical holder mounted to the OLED panel to maintain the quasi-spherical display surface.

15. The OLED display of claim 11, wherein the OLED panel includes:
a flexible substrate layer;
a thin film transistor (TFT) layer; and
an OLED layer.

16. The OLED display of claim 15, wherein:
the OLED layer defines the gore shaped panel portions;
the TFT layer includes metal traces at gap portions of the TFT layer between the adjacent first end portions and the adjacent second end portions of the gore shaped panel portions; and
the gap portions of the TFT layer are bent behind the adjacent first end portions and adjacent second end portions of the OLED layer.

17. The OLED display of claim 11, wherein the OLED panel includes a panel driver at the first end portion or second end portion of each gore shaped panel portion.

18. The OLED display of claim 17, wherein adjacent gore shaped panel portions include panel drivers at opposite end portions.

19. The OLED display of claim 17, further comprising a controller configured to drive pixels at a middle portion of a gore shaped panel portion at a higher resolution than pixels at a first end portion and second end portion of the gore shaped panel portion.

20. A head-mounted display (HMD), comprising:
a left quasi-spherical organic light emitting diode (OLED) display and a right quasi-spherical OLED display, each OLED display including:
an OLED panel having a series of gore shaped panel portions that form a quasi-spherical display surface, each gore shaped panel portion including a middle portion, a first end portion at a first side of the middle portion, and a second end portion at a second side of the middle portion opposite the first side, each gore shaped panel portion being tapered at the first and second end portions relative to the middle portion, the OLED panel including first bend regions between third sides of adjacent middle portions of the series of gore shaped panel portions, wherein the OLED panel is bent along the first bend regions and each gore shaped panel portion is bent to join adjacent first end portions and adjacent second end portions of the gore shaped panel portions;
a left optics block to direct light emitted from the left quasi-spherical OLED display; and
a right optics block to direct light emitted from the right quasi-spherical OLED display.

* * * * *

UNITED STATES PATENT AND TRADEMARK OFFICE
CERTIFICATE OF CORRECTION

| | |
|---|---|
| PATENT NO. | : 10,409,080 B2 |
| APPLICATION NO. | : 15/422338 |
| DATED | : September 10, 2019 |
| INVENTOR(S) | : Richards et al. |

It is certified that error appears in the above-identified patent and that said Letters Patent is hereby corrected as shown below:

In the Claims

In Column 12, Claim 6, Line 38, delete "a OLED" and insert -- an OLED --, therefor.

Signed and Sealed this
Tenth Day of March, 2020

Andrei Iancu
*Director of the United States Patent and Trademark Office*